6/23/81    XR    4,275,446

United States Patent [19]
Blaess

[11] 4,275,446
[45] Jun. 23, 1981

[54] METHOD AND APPARATUS FOR MEASUREMENT OF ATTENUATION AND DISTORTION BY A TEST OBJECT

[75] Inventor: Gerhard Blaess, Olching, Fed. Rep. of Germany

[73] Assignee: Siemens Aktiengesellschaft, Berlin and Munich, Fed. Rep. of Germany

[21] Appl. No.: 88,091

[22] Filed: Oct. 24, 1979

[30] Foreign Application Priority Data

Nov. 13, 1978 [DE]    Fed. Rep. of Germany ....... 2849119

[51] Int. Cl.³ .............................................. H04B 3/46
[52] U.S. Cl. ..................... 364/487; 364/485; 364/726; 324/57 DE; 179/175.3 R; 455/67
[58] Field of Search ................ 364/485–487, 364/553, 576, 726; 371/22; 324/57 DE, 77 A, 77 B, 77 R; 179/175.3 R, 175.2 C, 175.2 D; 375/10, 60; 328/14, 162, 163, 188; 455/67

[56] References Cited
U.S. PATENT DOCUMENTS

| | | | |
|---|---|---|---|
| 3,845,395 | 10/1974 | Murphree ............................ 328/14 |
| 3,846,593 | 11/1974 | Bradley ......................... 179/175.3 R |
| 3,887,775 | 6/1975 | Montefusco et al. .......... 324/57 DE |
| 3,952,189 | 4/1976 | Fabricius .............................. 328/14 |
| 3,973,112 | 8/1976 | Sloane ............................. 324/77 B |
| 4,039,769 | 8/1977 | Bradley .......................... 324/57 DE |
| 4,067,060 | 1/1978 | Poussart et al. .................. 324/77 B |
| 4,093,988 | 6/1978 | Scott ................................. 324/77 B |
| 4,093,989 | 6/1978 | Flink et al. ........................ 324/77 B |

OTHER PUBLICATIONS

"Transfer Function Measurement Using Fast Pulses", by R. C. French, published in Electronic Engineering, Aug. 1966, pp. 516–519.
"Measuring Waveform Distortion With a PAR Meter", by W. T. Cochran, published in Bell Lab Record, Oct. 1965, pp. 369–371.
CCITT Recommendation, Recommendation 0.81, vol. IV.2, pp. 44–50.

*Primary Examiner*—Charles E. Atkinson
*Assistant Examiner*—Gary Chin
*Attorney, Agent, or Firm*—Hill, Van Santen, Steadman, Chiara & Simpson

[57] ABSTRACT

A method for measurement of transmission characteristics consists of supplying a test pulse to an object under test and measuring the pulse at the output of the object under test with the assistance of Fourier analysis. The test pulse is made up of a plurality of components which are equally spaced apart in frequency, and the initial phase values of each of the components are chosen so as to reduce loading of the object under test to an acceptable level. Evaluation of the test pulse at the output of the object under test yields attenuation and phase shift characteristics for each component frequency.

17 Claims, 6 Drawing Figures

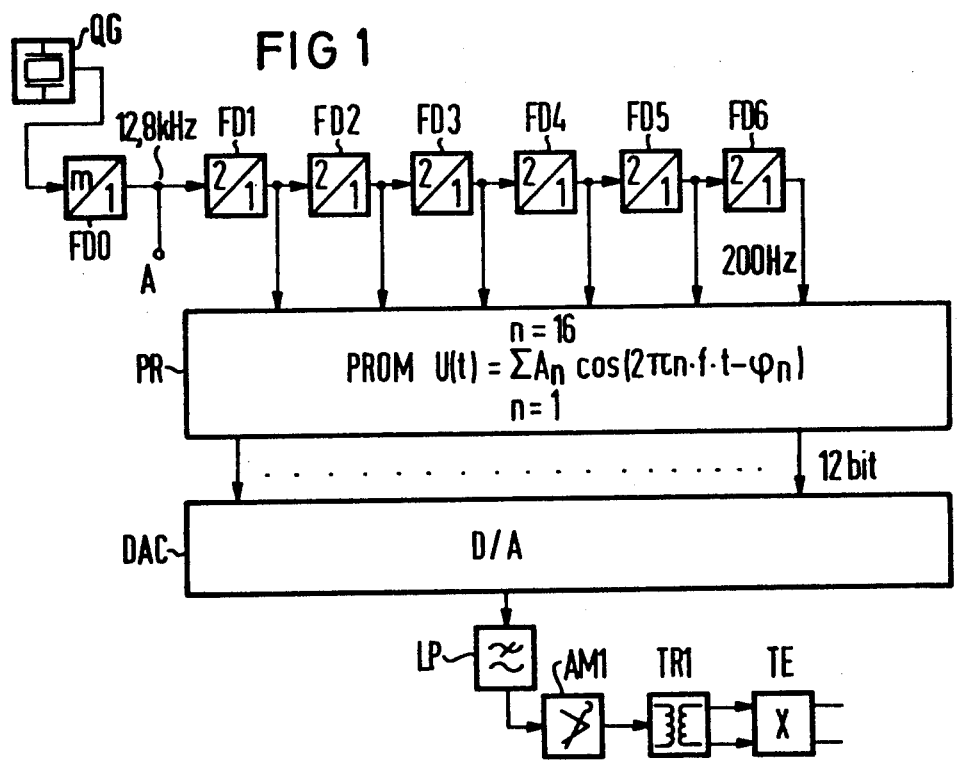
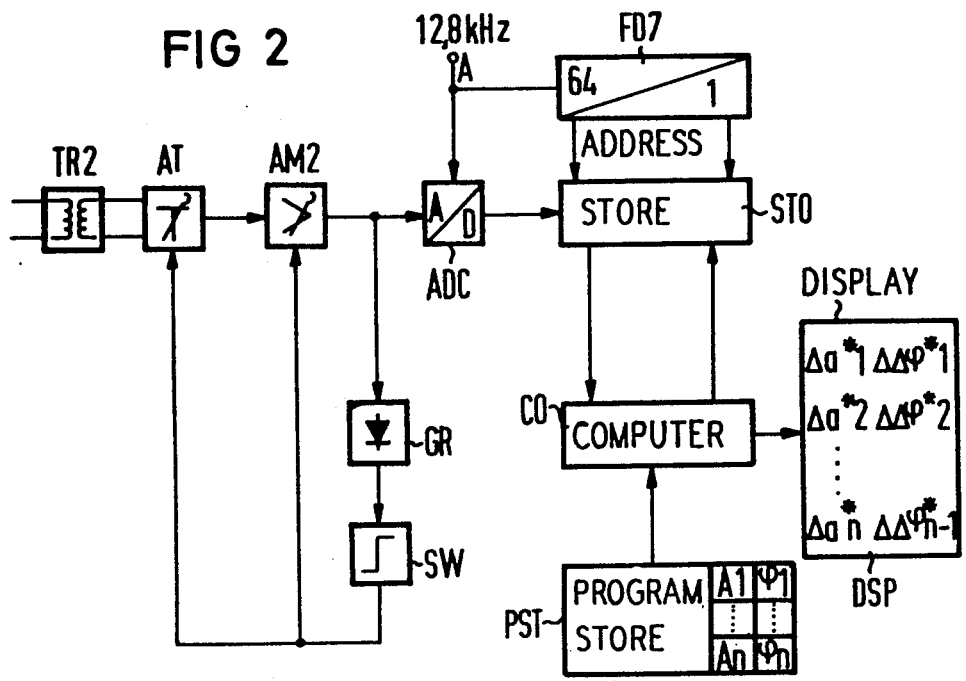

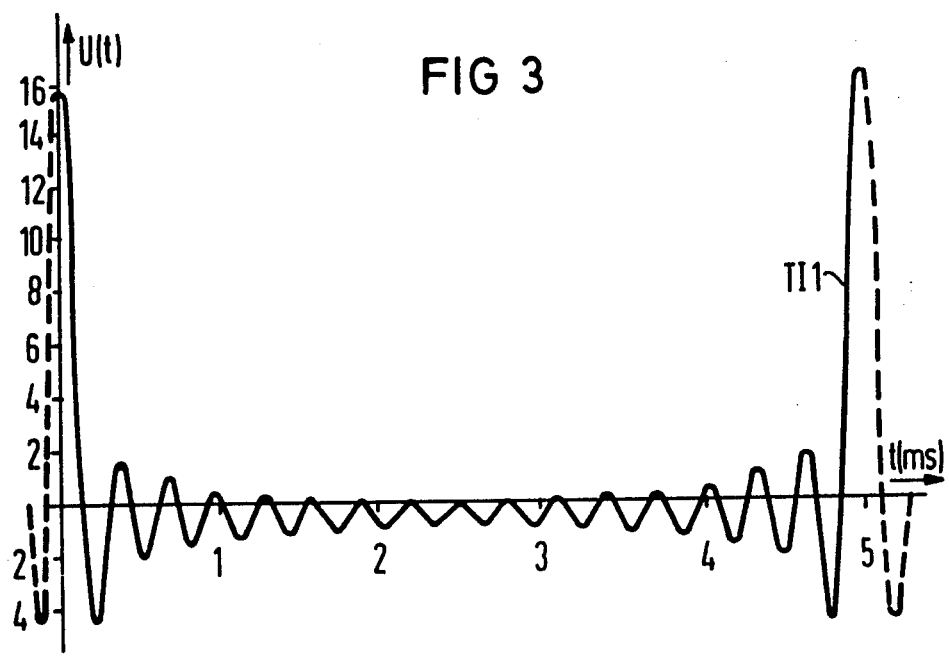
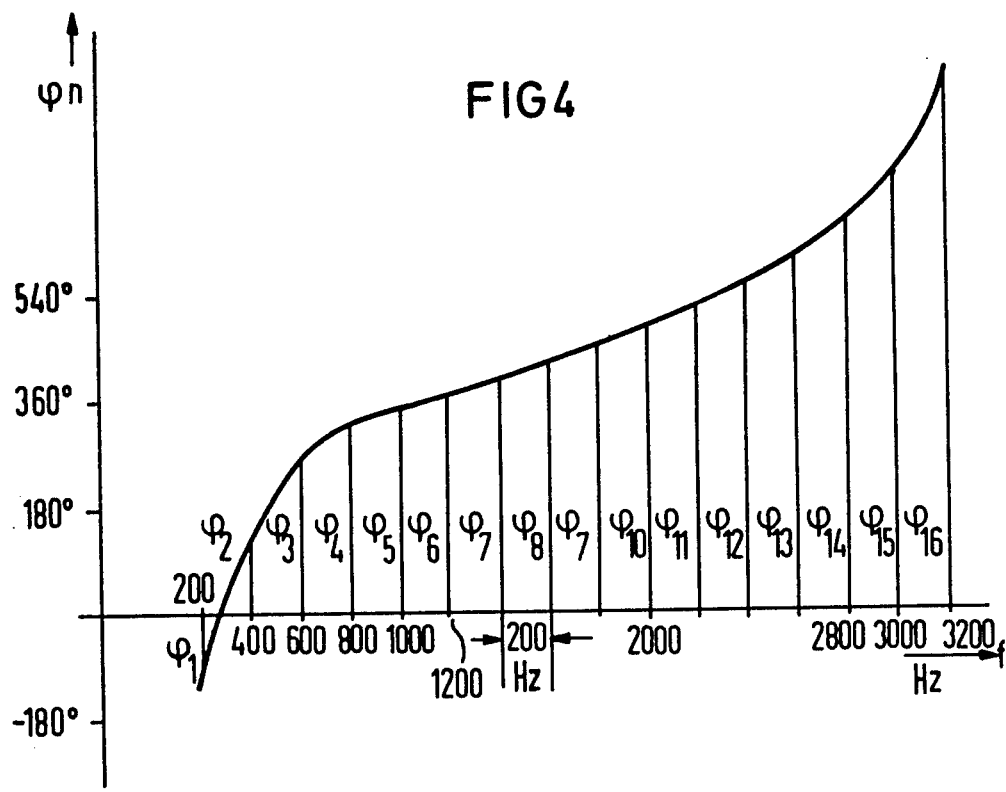

METHOD AND APPARATUS FOR MEASUREMENT OF ATTENUATION AND DISTORTION BY A TEST OBJECT

FIELD OF THE INVENTION

This invention relates to a method and apparatus for the measurement of attenuation and delay time distortion in a test object to which a test pulse is supplied.

THE PRIOR ART

A method for measuring the transfer function of an object under test is known from the article in "Electronic Engineering", August, 1966, pages 516-519. As described therein, a function having infinitely narrow pulses supplies a constant amplitude distribution of harmonics at all frequencies to a device under test. A sequence of such narrow pulses is delivered to the object under test, and the waveform of the signal which is produced at the output of the object under test, is recorded after sampling and subjection to Fourier analysis. The test pulse (or exciting pulse) is also sampled and subjected to Fourier analysis in the same way. In practice, an infinitely short pulse cannot be employed, but a pulse which is as short as possible is used, which produces a spectral function of sin x/x.

The prior art method has the disadvantage that both the test pulse and the distorted pulse must be recorded and subjected to Fourier analysis. When the object under test is a transmission line, the problem arises that the test pulse is not directly available at the output end of the transmission line. Thus, either an additional transmission must be undertaken of the exciting pulse, or data relating thereto, or else the data at the output end of the transmission line must be retransmitted to the input end. This requires a relatively large amount of equipment, and there is also the disadvantage that any kind of transmission failure directly influences the result of the measurement. Further, errors may enter into the measurement during the Fourier analysis, both at the input end and the output end of the transmission line.

The infinitely numerous harmonics of the exciting function sin x/x occurring with such pulses occupy very wide frequency bands and lead to disruptions of communications in adjacent channels when the measurement is undertaken in specific channels. It is also disadvantageous for practical operation that the phases of the individual harmonics and their amplitudes are predetermined by the form of the exciting pulse employed and therefore cannot be freely selected.

The loading of the system being tested by narrow pulses may be determined by calculation of the Crest Factor $c_f$. The Crest Factor is defined by the ratio of the peak voltage value to the effective voltage value. When very narrow rectangular pulses are used for excitation, the Crest Factor is very high and cannot be changed.

BRIEF SUMMARY OF THE INVENTION

A principal object of the present invention is to provide a method and apparatus for measuring the transmission characteristics of an object under test in which the Crest Factor $c_f$ is changed in a simple manner such that the lowest possible loading of the system is achieved during the measuring operation.

In accordance with one embodiment of the invention, the Crest Factor is reduced to a value which corresponds to an acceptable load of the object under test, by means of selection at different initial phase angles $\phi_n$ for the harmonic individual oscillations of which the test pulse is composed.

In the present invention, the test pulse consists of a series of oscillations of different frequencies which have predetermined amplitudes in initial phases and are formed according to the equation $$V(t) = \sum_1^n A_n \cdot \cos(2 \cdot \pi \cdot n \cdot f \cdot t - \phi_n)$$

wherein $A_n$ is the amplitude of a component n and $\phi_n$ is the initial phase of a component having a frequency $n \times f$.

An advantageous result of the present invention is that the adjustment of the initial phase values $\phi_1$ through $\phi_n$ at the input side of the object under test can take place very simply and has no disadvantageous consequences affecting the quality of the measurement. Particularly high voltage peaks can be avoided which would otherwise cause overdriving or non-linearities in the transmission. Since the non-linearities and overdrive caused by excessive voltage peaks occur only during measurement operations, there is a danger with the prior art methods that an error is generated in the measurement itself, which error is not present in practical operation of the transmission line under test. Such errors are avoided by the present invention.

The apparatus in one embodiment of the present invention incorporates a storage device which is provided at the input side of the object in a test which contains a multiplicity of time sample values from a test pulse formed with the individual components with their different initial phase angles. These sampling values are read out rapidly in succession to form the test or exciting pulse. A storage device is also provided on the output side of the object under test in which the parameters of the test pulse are likewise stored and are available for evaluation of the distorted pulse received at the output of the object under test.

BRIEF DESCRIPTION OF THE DRAWINGS

Reference will now be made to the accompanying drawings in which:

FIG. 1 is a functional block diagram of apparatus for generating a test pulse;

FIG. 2 is a functional block diagram of apparatus located at the output side of the object under test for evaluating the distorted test pulse;

FIG. 3 is an illustration of a test pulse having an unfavorable Crest Factor;

FIG. 4 is a graph of the phase distribution of components of a test pulse having an improved Crest Factor;

DESCRIPTION OF THE PREFERRED EMBODIMENT

Figure 5:
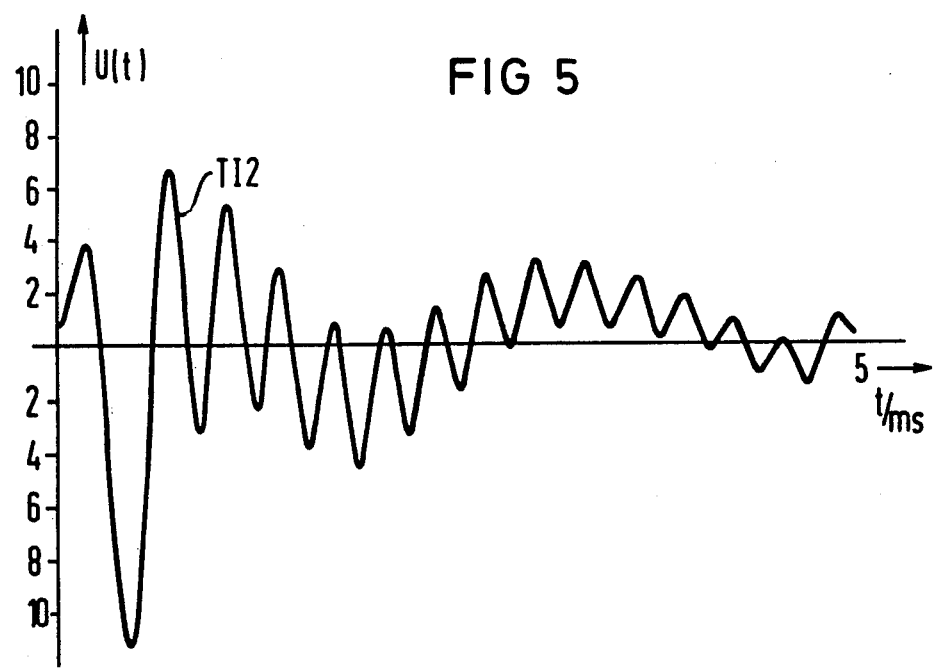
FIG. 5 is an illustration of a test pulse constructed in accordance with the phase distribution illustrated in FIG. 4.

Referring now to FIG. 1, apparatus is illustrated for generating a test pulse to be applied to an object under test TE. As an example, the object under test TE may be a data or telephone channel having a bandwidth of 300 Hz through 3 kHz. A crystal oscillator QG generates a signal which is connected to the input of a frequency divider FDO, which produces at its output a square wave of 12.8 kHz. This signal is applied to a series of six frequency dividers FD1 through FD6, connected in cascade, to form a binary counter. The output of each of the flip-flops FD1–FD6 are connected as address inputs to a programmable read-only memory unit (PROM)PR. A total of sixty-four different combinations of output signals are produced by the frequency dividers FD1–FD6, which successively address sixty-four storage locations within the PROM unit PR. Each memory location of the PROM unit PR contains a 12-bit word which, when accessed, is read out to the input terminals of a digital-to-analog converter DAC, which produces at its output an analog signal having an amplitude at each instant corresponding to the 12-bit digital word being accessed at that instant. Each of the 12-bit words contains the digitized instantaneous amplitude value of an undistorted time function:

$$V(t) = \sum_{n=1}^{n=16} A_n \cdot \cos(2\pi \cdot n \cdot f \cdot t - \phi_n)$$

By reading out the data stored in successive storage locations of the PROM unit PR, a test pulse is generated as a step curve, the amplitude of which proceeds directly from step-to-step without any gap or return to a reference value between successive steps. My copending application Ser. No. 910,769 filed May 30, 1978 discloses an arrangement for generating a test pulse.

The test pulse has a period given by $1/f_1$ whereby $f_1$ represents the frequency of the lowest harmonic, which in the example which follows is 200 Hz.

A test pulse may be formed, for example, of sixteen individual harmonics, each having a frequency separation of 200 Hz, occupying a frequency band of between 200 Hz through 3200 Hz. A sampling frequency must be employed which is high enough so that the highest frequency (3200 Hz) is sampled more than twice. According to the sampling frequency, it must exceed 6400 Hz. In the present example, the selected sampling frequency is 12.8 kHz, so the sampling requirement for the highest frequency is met with certainty.

Since the lowest harmonic frequency is 200 Hz, the period of the test pulse is 5 ms. During each 5 ms period, the sixty-four successive sampling values are read out of the PROM unit PR, one for each cycle of the 12.8 kHz frequency, so that the interval between successive steps of the test pulse is 78.125 microseconds.

The waveform of the test pulse, with its sixteen components, is determined either by computation or graphically, with individual amplitudes $A_1$ through $A_{16}$, and with initial phase angles of $\phi_1$ through $\phi_{16}$. The amplitude of the composite test pulse is digitized and entered into the storage locations of the PROM unit PR, each digitized value corresponding to the average amplitude during an interval of 78.125 microseconds. Accordingly, when the sixty-four storage locations of the PROM unit are accessed successively, the output of the digital-to-analog converter DAC corresponds closely to the graph or computed test pulse. A low-pass filter LP is connected to the output of the digital-to-analog converter DAC to smooth the test pulse. During operation, all of the storage locations of the PROM unit PR are accessed repetitively, so that after each 5 ms period of the test pulse, a new test pulse begins at once. A sufficient number of test pulses are transmitted in succession in this manner until transients are dissipated, and the response at the output end of the object under test is constant from period to period. At least one period T has been sampled at the output end of the object under test, at the same rate as the sampling takes place at the input end, to yield sixty-four sampling values, which are stored and subjected to the Fourier analysis in either analog or digital form. The result of such analysis is to produce parameters corresponding to the individual amplitude values $A_1*$ through $A_{16}*$ (at the output end of the object under test) as well as the corresponding phase angles $\phi_1*$ through $\phi_{16}*$.

If there is any distortion such as attenuation or phase shift which occurs in the low-pass filter LP, this can be compensated by means of a preliminary correction of the sampling values so as to counteract or compensate for the distortion.

The output of the low-pass filter LP is passed through an amplifier $AM_1$, which has an adjustable gain, to an adapter circuit TR1 which may be for example a line transmitter. The output of the adapter circuit TR1 is connected to the input of the object of the test TE.

FIG. 2 illustrates apparatus located at the output side of the device under test TE, for evaluating the transmission characteristics of the object under test TE. The distorted test pulse first arrives at an adapter circuit TR2, the output of which is connected to the input of an attenuator AT. The output of the attenuator is passed through an amplifier AM2 and arrives at the input of an analog-to-digital converter unit ADC. The output of the amplifier AM2 is also connected through a rectifier GR to the input of a threshold circuit SW which produces a signal which adjusts the gain of the attenuator AT and the amplifier AM2. In this way, the gain of the attenuator and amplifier are adjusted so that the maximum amplitude of the distorted test pulse is equal to a fixed value. The speed of response of the circuit including the rectifier GR and the threshold circuit SW is sufficiently slow, so that the characteristics of the attenuator AT and the amplifier AM2 remain substantially constant throughout the period of the received pulse, after an initial transient period.

The analog-to-digital converter ADC is provided with a sample-and-hold circuit, which circuit is sampled by clock pulses at a frequency of 12.8 kHz, supplied to a terminal A. These signals correspond precisely to the clock signals employed in the apparatus of FIG. 1, and may be derived by connection to terminal A at the output of the divider FDO in FIG. 1.

The clock frequency is also supplied to a frequency divider FD7 which functions as a 6-bit binary counter, the outputs of which are connected to the address inputs of a storage device STO. The divider FD7 may be constructed identically to the chain of frequency dividers FD1–FD6 illustrated in FIG. 1. The storage device STO functions to store the digital outputs of the analog-to-digital converter ADC at each of sixty-four memory locations which are accessed by FD7. After sixty-four time periods have been sampled and stored, the storage device contains the digitized amplitudes corresponding to one 5 ms period of the test pulse, and the sampling and storage operation is then terminated (by means not shown).

Subsequently, the storage device STO cooperates with a computer CO by which the sixty-four sample values are subjected to a fast Fourier transform, in the manner described in the book by G. Oran Brigham, "The Fast Fourier Transform", at pages 163–171. The program for this transform is contained in the program storage device PST, which is connected with a computer CO, and which also incorporates a storage unit storing representations of the individual amplitude values $A_1, A_2, \ldots A_n$, and the initial phase angles $\phi_1, \phi_2, \ldots \phi_n$, for the original (undistorted) test pulse.

The fast Fourier transform program converts data from the time domain into the frequency domain, to yield the real ($R_{n*}$) and imaginary ($I_{n*}$) parts for each of the sixteen harmonics making up the test pulse. From these parts, the amplitude $A_{n*}$ for each harmonic may be calculated according to the equation:

$$A_{n*} = \sqrt{(R_{n*})^2 + (I_{n*})^2}$$

The phase $\phi_{n*}$ may also be calculated, according to the equation:

$$\phi_{n*} = \text{arctg}\, \frac{I_{n*}}{R_{n*}}$$

Programs for making these calculations are also contained in the program store unit PST.

Where the object under test TE has a frequency dependent attenuation, such as due to a filter characteristic or the like, then the individual amplitudes $A_{1*} \ldots A_{n*}$ are not identical to the individual amplitudes $A_1 \ldots A_n$ of which the undistorted test pulse was composed. The change in amplitude $a_{n*}$ due to the object under test, which indicates the attenuation distortion at the various frequency values $F_1$ through $F_n$, is calculated for each harmonic by the equation:

$$a_{n*} = \frac{A_{n*}}{A_n}.$$

The values $a_{n*}$ for the several harmonics is presented visually on a suitable display device DSP controlled by the computer CO. The display program is contained in the program store unit PST, which also stores the amplitude distribution of the original test pulse.

Where the object under test also has a frequency dependent phase shift, then the difference in the phase angle of two adjacent harmonics is a measure of the group transmit time, according to the equation:

$$\tau_g = \frac{d\phi*}{d\omega} \approx \frac{\Delta(\Delta\phi_{n*})}{\Delta\omega}$$

This equation gives a precise result when there are a great number of harmonics within the pass band being investigated. In that event, the simplification $\Delta\omega = 2\pi \cdot f_1 = $ constant is valid.

In order to determine the difference in the phase change of neighboring harmonics, the change in phase of each harmonic is first determined according to the equation:

$$\Delta\phi_{n*} = \phi_{n*} - \phi_n$$

The values of $\phi_n$, which are the phases of the harmonics of the original test pulse, are stored in the program store unit PST. The difference in the phase change of two neighboring harmonics is thus $$\Delta(\Delta\phi_{n*}) = (\phi_{n*+1} - \phi_{n+1}) - (\phi_{n*} - \phi_n)$$
$$= (\phi_{n*+1} - \phi_{n*}) - (\phi_{n+1} - \phi_n)$$

Thus, the group transmit time $\tau_g$ can be calculated from data located in the storage device STO and the program store PST, and presented on the display device DSP.

Although the group transit time $\tau_g$ can be measured absolutely when a complete loop of a transmission line is being tested, the absolute value of $\tau_g$ cannot be determined when only a segment is being measured, because of lack of the reference time. By the procedure outlined above, however, the group transit time distortion is indicated at any selected frequency.

Although the apparatus of FIGS. 1 and 2 have been described as digital devices, it is possible to employ analog memories and evaluation devices in place of the digital ones.

Although the time domain values for the successive portions of the test pulse are stored at the input side in the PROM unit PR, preferably the values for the frequency domain are stored in the program control unit PST at the output side, because the Fourier analysis is carried out at the output end of the object under test, and the comparison of the Fourier parameters can be made there simply.

Referring now to FIG. 3, a waveform of the test pulse TI1 is illustrated for a period of 5 ms. The test pulse illustrated in FIG. 3 contains sixteen harmonics of the base frequency 200 Hz extending from 200 Hz (n=1) through 3200 Hz (n=16). In the waveform of FIG. 3, all of the harmonics are of equal amplitude and have an initial phase angle of 0°. This waveform has a Crest Factor of 5.66, which occasions a relatively great system load in the possibility of distortions in the measurement due to over-driving and non-linearities. When the initial phase angles of the harmonics are selected different from 0°, the Crest Factor can be substantially lower.

FIG. 4 illustrates a graph of different phase angles for each of the sixteen harmonics referred to above, for a frequency range of 200 through 3200 Hz. In its lower range, from approximately 200 through 1000 Hz, the curve of FIG. 4 corresponds to a parabola of the third order, whereas a correspondence to a parabola of the second order between about 1000 Hz and 2600 Hz. Above 2600 Hz, the curve conforms to a parabola of the third order. A waveform made up of sixteen components having the phase angles according to the graph of FIG. 4 is illustrated in FIG. 5. The initial phase angles of all of the components are stored in the program storage unit PST so they can be used to measure the group transit time distortion. The waveform of FIG. 5 is shown on the same time and amplitude scale as that of FIG. 3, where the components have the initial phase angles according to FIG. 4 and all have equal amplitudes. This waveform exhibits substantially smaller voltage peaks than the test pulse illustrated in FIG. 3. The Crest Factor for the test pulse T12 shown in FIG. 5 is only 4.03.

Figure 6:
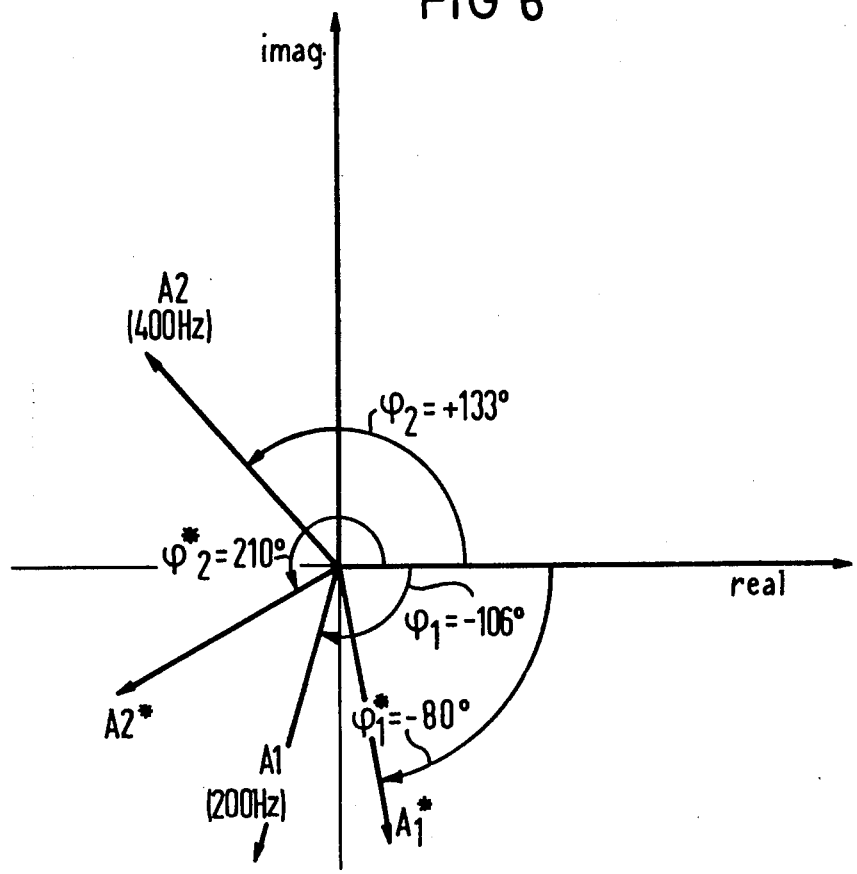
FIG. 6 is a vector diagram of individual components of the test pulse after Fourier analysis at the output end of the object under test.

FIG. 6 illustrates a vector diagram showing the relationships for the amplitudes and phases of the first two harmonics of the test pulse. The initial amplitudes A1 and A2 are equal, and the initial phase angles are taken from FIG. 4. The vectors $A_1$ and $A_{1*}$ correspond to a frequency $F_1 = 200$ Hz, while the vectors $A_2$ and $A_{2*}$ correspond to a frequency $F_2$ of 400 Hz. $A_1$ has an initial phase angle of $-106°$; $A_2$ has an initial phase angle of $+133°$. A illustrated in FIG. 6, at the output of the object under test, the phase angle of the first component is $-80°$ and the phase angle of the second component is $210°$. Accordingly, the calculated quantity $\Delta\Delta\phi_1* = 210° + 80° - 133° + 106° = 51°$. The group transit time $\tau_g$ can then be determined from the value of $\Delta\Delta\phi_n*$.

It is also possible to reduce the Crest Factor, in addition to selecting different initial phase angles of the components, by selecting amplitude values $A_1$ through $A_n$ which are different for the individual components. This can achieve a lower Crest Factor because, in the calculation of the Crest Factor, the linear sum of the amplitude values appear in the numerator, whereas the RMS values appear in the denominator. When the object under test has a filter characteristic, it is advantageous to select amplitude values near the cut-off regions of the filter to be significantly greater than the amplitude values for frequencies in the middle of the pass band of the filter. For example, when the object under test operates as a band pass filter, the amplitude values $A_1$ through $A_5$ near one end of the band pass can have the standardized amplitude value 1, and likewise the amplitude values $A_{12}$ through $A_{16}$ at the opposite end of the pass band. The amplitude values $A_6$ through $A_{11}$, lying in the mid-portion of the pass band, are selected to be significantly smaller, which can be accomplished without disadvantage because they arrive at the output of the object under test with a level which is great enough for a precise measurement, due to the lower attenuation of them by the object under test.

A further possibility for reducing the Crest Factor consists of setting the amplitudes of some of the individual harmonics at 0. For example, when the frequency separation between the components of the test pulse is equal to 100 Hz, then $F_1 = 100$ Hz, $F_2 = 200$ Hz, etc. When the amplitude value $A_1$ (4 $F_1 = 100$ Hz) is set at 0, the amplitude value $A_1$ no longer enters into the calculation of the Crest Factor, but only $A_2$ ($F_2 = 200$ Hz) through $A_{33}$ ($F_{33} = 3300$ Hz) make contributions to the Crest Factor. Accordingly, the Crest Factor has a more favorable value.

Another possibility for reducing the Crest Factor is to select the initial phase angles of each of the constituents at $90°$, rather than $0°$. By so doing, the excessive voltage peak which appears in FIG. 3 at the beginning and at the end of the test pulse TI1 is avoided, because the maxima of the individual oscillations no longer coincide. For example, when the test pulse is made up of thirty-two harmonic components, with $A_1 = 0$ (and $F_1 = 100$ Hz) and $A_2$ through $A_{33}$ are all of identical magnitude, a Crest Factor of 6.75 can be achieved, as opposed to a Crest Factor of 8.0 when thirty-two cosine oscillations of the same amplitude have the same initial phase angle equal to 0. Still lower values of the Crest Factor can be realized if the values of the initial phase angle are alternately selected at $0°$ and $90°$. For example, the odd-numbered components ($n = 1, 3 \ldots$) have the initial phase angle equal to 0, and the even-numbered components ($n = 2, 4 \ldots$) have an initial phase angle of $90°$. In such a case, when $A_1 = 0$ and $A_2$ through $A_{33}$ are equal, the Crest Factor is 5.75. In this case, the waveform of the test pulse can be determined by the relation:

$$V(t) = \sum_{n=2}^{n=33} 1 \cdot \cos(2\pi \cdot n \cdot f \cdot t - \phi_n)$$

A still lower Crest Factor is achieved when the initial phase angles of the thirty-two components are chosen as follows (again, $A_1 = 0$):

| n | initial phase angle |
| --- | --- |
| 2, 3, 4, 5, 10, 18, 20, 26 | 0° |
| 23, 33 | 45° |
| 11, 16, 29, 32 | 90° |
| 25, 31 | 135° |
| 6, 12, 14, 19, 21, 22, 28, 30 | 180° |
| 7, 17 | 225° |
| 8, 13, 24, 27 | 270° |
| 9, 15 | 315° |

When the components have equal amplitudes (with $A_1 = 0$) and the initial phase angles are chosen according to the above table, the Crest Factor is very low and equals 2.68.

From the foregoing, it will be clear to those skilled in the art how the apparatus and method of the present invention can be used to make measurements of the transmission characteristics of objects under test with a very low Crest Factor in comparison with Crest Factors of prior art methods. In FIGS. 1 and 2, the details of the apparatus employed has not been disclosed, because the individual components of such apparatus are available in the art, and their construction and use is familiar to those working in the art. The specific computer which may be employed, as a matter within the choice of one skilled in the art, and the particular program steps which are employed in carrying out the method of the present invention are adapted to the computer which is chosen, as well understood in the art. Moreover, the method of the present invention may be practiced without the use of a computer, since the calculations involving the Fourier transform, and the comparison of the parameters corresponding to the initial and distorted test pulse may be carried out by hand, if desired. Other modifications and additions may be made in the apparatus and method of the present invention without departing from the features of novelty thereof, which are intended to be defined and secured by the appended claims.

What is claimed is:

1. A method of measuring the transmission characteristics of an object under test by applying a test pulse to the input of the object and by evaluating, by Fourier analysis, the deformation of the test pulse as it is produced at the output of the object under test, said test pulse being formed of a plurality of components having different frequencies and predetermined amplitudes and initial phase angles, and formed according to the equation:

$$V(t) = \sum_{1}^{n} A_n \cdot \cos(2\pi \cdot n \cdot f \cdot t - \phi_n)$$

where $A_n$ is the amplitude of the nth component and $\phi_n$ is the initial phase angle of component n, such component having a frequency equal to $n \times f$, said components being summed to form a test pulse, said components having initial phase angles chosen to reduce the Crest Factor of the test pulse, thereby reducing the loading on the object under test during the period of measurement.

2. The method according to claim 1, including the step of storing, at a location near the output of the object under test, the initial phase angles $\phi_1$ through $\phi_n$ employed for the components of the test pulse, and comparing said stored values with values corresponding to the phase angles of components of the distorted pulse in the determination of phase distortion of said test pulse by said object under test.

3. The method according to claim 1, in which the initial phase angles of said components are chosen in accordance with a curve relating initial phase angles of said components to their frequencies, said curve having the form of a third order parabola for components in a lower and an upper frequency range, and having the form of a second order parabola for a frequency range intermediate said upper and lower frequency ranges.

4. The method according to claim 1, wherein the initial phase angle for all of said components is set equal to 90°.

5. The method according to claim 1, wherein the initial phase angles for said components are alternately set at 0° or 90°.

6. The method according to claim 1, including the step of setting the amplitude values $A_1$ through $A_n$ at at least two different values.

7. The method according to claim 6, including the step of setting the amplitude values greater for components having frequencies near the cut-off, and lesser for components having frequencies near the center of the pass band, when the object of the test has a filter characteristic.

8. The method according to claim 1, including the step of applying said test pulse to the input of said object under test for an interval at least equal to the period of the lowest frequency component of said test pulse.

9. The method according to claim 1, including the step of applying successive test pulses to the input of said object under test, each test pulse after the first such test pulse beginning coincidentally with the end of the preceding test pulse.

10. The method according to claim 1, including the step of storing in a storage device sampling values corresponding to a succession of time intervals of a test pulse in a storage device, forming said test pulse by successively reading out from said storage device values for successive intervals, and performing said reading out function at a rate which is more than twice as high as the highest frequency component of the test pulse.

11. The method according to claim 1, including the step of selecting an amplitude equal to 0 for a signal which is nominally a component of said test pulse, according to said equation.

12. The method according to claim 11, wherein the nominal components whose amplitudes are set at 0 have small values of n.

13. The method according to claim 1, including the step of setting the initial phase angles of all of said components to multiples of 45°.

14. Apparatus for measuring the transmission characteristics of an object under test, comprising, in combination, first storage means located near the input of said object under test, said first storage means storing a plurality of sampling values corresponding to the magnitude, at consecutive time intervals, of a test pulse formed of a plurality of individual components at a plurality of frequencies, means connected to said first storage means for reading out said sampling values from said first storage means in succession, and for applying them to said input, second storage means located near the output of said object under test, said second storage means storing values corresponding to the initial phase angles of all of the components of said test pulse, means for sampling sequential intervals of the test pulse as it arrives at the output of said device under test, means for deriving values corresponding to the phase angles of said components as they are presented at the output of said device under test, and means connected to said second storage means for comparing said derived values with the values stored in said second storage means.

15. Apparatus according to claim 14, wherein said first storage means comprises a digital storage device and including a digital-to-analog converter and a low pass filter connected between said first storage means and said object under test.

16. Apparatus according to claim 14, including a control circuit interconnected between the output of said device under test and the input of said sampling means for holding the maximum amplitude of said test pulse to a uniform level as it is sampled.

17. Apparatus according to claim 14, wherein said first storage means stores time domain data relating to said test pulse, and said second storage means stores frequency domain data relating to said test pulse.

* * * * *